(12) United States Patent
Ihara et al.

(10) Patent No.: US 7,696,547 B2
(45) Date of Patent: Apr. 13, 2010

(54) SEMICONDUCTOR DEVICE WITH BURRIED SEMICONDUCTOR REGIONS

(75) Inventors: Hisanori Ihara, Kanagawa-ken (JP); Nagataka Tanaka, Kanagawa-ken (JP); Hiroshige Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 993 days.

(21) Appl. No.: 11/210,681

(22) Filed: Aug. 25, 2005

(65) Prior Publication Data

US 2006/0046369 A1    Mar. 2, 2006

(30) Foreign Application Priority Data

Aug. 25, 2004    (JP)    .............................. 2004-244692

(51) Int. Cl.
*H01L 31/062* (2006.01)
(52) U.S. Cl. .................. 257/294; 257/291; 257/292; 257/463; 257/E31.053
(58) Field of Classification Search ......... 257/290–294, 257/461–463, E31.053, E31.079, E31.082
See application file for complete search history.

(56) References Cited

U.S. PATENT DOCUMENTS 6,504,193 B1 *    1/2003    Ishiwata et al. ............. 257/291
6,521,925 B1      2/2003    Mori et al.
2004/0140491 A1   7/2004    Rhodes et al.

\* cited by examiner

*Primary Examiner*—Matthew E Warren
(74) *Attorney, Agent, or Firm*—Oblon, Spivak, McClelland, Maier & Neustadt, L.L.P.

(57) ABSTRACT

A solid-state image sensor having a well of a first conductivity type; a photoelectric conversion region having a second conductivity type formed in the well storing charges obtained from a photoelectric conversion; a drain region having the second conductivity type formed in the well apart from a surface of the well; and a gate electrode formed on the surface of the well via a gate insulator, the gate electrode transferring the charges from the photoelectric conversion region to the drain region. Alternatively, a transistor includes a first semiconductor region having a first conductivity type; second and third semiconductor regions having a second conductivity type formed in the first semiconductor region, the second and third semiconductor regions being separated from each other by a portion of the first semiconductor region serving as a channel region; an insulator layer provided on a surface of the first semiconductor region in contact with the channel region; a gate electrode provided on the insulator layer; and the first semiconductor region includes a shield semiconductor region of the first conductivity type disposed between the surface of the first semiconductor region and at least one of the second and third semiconductor regions such that the at least one of the second and third semiconductor regions is sandwiched between the shield region and the first semiconductor region.

11 Claims, 11 Drawing Sheets

SEMICONDUCTOR DEVICE WITH BURRIED SEMICONDUCTOR REGIONS

CROSS REFERENCES TO RELATED APPLICATION

This application is based upon and claims the benefit of priority from the Japanese Patent Application No. 2004-244692, filed on Aug. 25, 2004, the entire contents of which are incorporated herein by reference.

BACKGROUND OF THE INVENTION

1. Field of the Invention

The present invention relates to a semiconductor device that has at least one of a drain and a source buried in a semiconductor layer. More specifically, the present invention relates to a solid state image sensor that have at least one of a drain region and a photoelectric conversion region buried in the semiconductor layer, away from a surface of the semiconductor layer.

2. Discussion of the Background

An amplifying MOS image sensor (CMOS sensor) is adapted to function as a solid state image sensor. One advantage of the amplifying MOS image sensor is the low power consumption. A conventional amplifying MOS image sensor is shown in Japanese patent No. 3484071.

In the conventional amplifying MOS image sensor, a drain region is formed in a surface of a semiconductor layer or a well, such that an upper edge of the drain region coincides with an upper surface of the semiconductor layer or well.

However, there are various crystal defects that are produced on the surface and the neighboring of the surface of the semiconductor layer or well, due to the forming process of the semiconductor device. These crystal defects are known by the one of ordinary skill in the art and a size of the neighboring of the surface of the semiconductor layer that is affected by the crystal defects due to the manufacturing of the device is also known in the art. Further, the amount of defects at the surface of the semiconductor layer is larger compared to a region inside the semiconductor layer. This difference in the amount of defects is determined by the damage to the surface of the semiconductor layer during manufacturing, for example when an interlayer dielectric is deposited on the surface of the semiconductor layer or when a drain region is formed inside the semiconductor layer. Thus, charges from a photoelectric conversion region or a photodiode (PD) formed in the semiconductor layer are trapped by the crystal defects, both inside the layer and at the surface of the semiconductor layer causing a leak current to occur from or into the drain region. For simplicity, the crystal defects inside the semiconductor layer are simply called crystal defects, and the defects in the surface of the same layer are called surface states.

Furthermore, some of the charges which are transferred to the drain region are trapped in the surface states or the crystal defects which exist in the semiconductor layer above the drain region, making less likely a discharge of the charges stored in the photoelectric conversion region. Thus, a S/N ratio (signal/noise ratio) of the conventional amplifying MOS image sensor is decreased, resulting in a poor performance.

SUMMARY OF THE INVENTION

According to one aspect of the present invention there is provided a solid-state image sensor that includes a well of a first conductivity type; a photoelectric conversion region having a second conductive type formed in the well and configured to store charges obtained from a photoelectric conversion; a drain region having the second conductivity type formed within the well apart from a surface of the well in a depth direction of the well; and a gate electrode formed on the surface of the well via a gate insulator, the gate electrode transferring the charges from the photoelectric conversion region to the drain region.

According to another aspect of the present invention there is provided a solid-state image sensor that includes a well of a first conductivity type; a photoelectric conversion region having a second conductivity type formed in the well and configured to store charges obtained from a photoelectric conversion; a drain region having the second conductivity type formed in the well apart from a surface of the well in a depth direction of the well; a drain shield region having the first conductivity type formed in the well, the drain shield region being formed in a surface part of the well above the drain region; and a gate electrode formed on the surface of the well via a gate insulator, the gate electrode transferring the charges from the photoelectric conversion region to the drain region.

According to still another aspect of the present invention there is provided a transistor that includes a first semiconductor region having a first conductivity type; second and third semiconductor regions having a second conductivity type formed in the first semiconductor region, the second and third semiconductor regions being separated from each other by a portion of the first semiconductor region serving as a channel region; an insulator layer provided on a surface of the first semiconductor region in contact with the channel region; a gate electrode provided on the insulator layer; and the first semiconductor region comprising a shield semiconductor region of the first conductivity type disposed between the surface of the first semiconductor region and at least one of the second and third semiconductor regions such that the at least one of the second and third semiconductor regions is sandwiched between the shield region and the first semiconductor region.

DETAILED DESCRIPTION OF THE EMBODIMENTS

Figure 1:
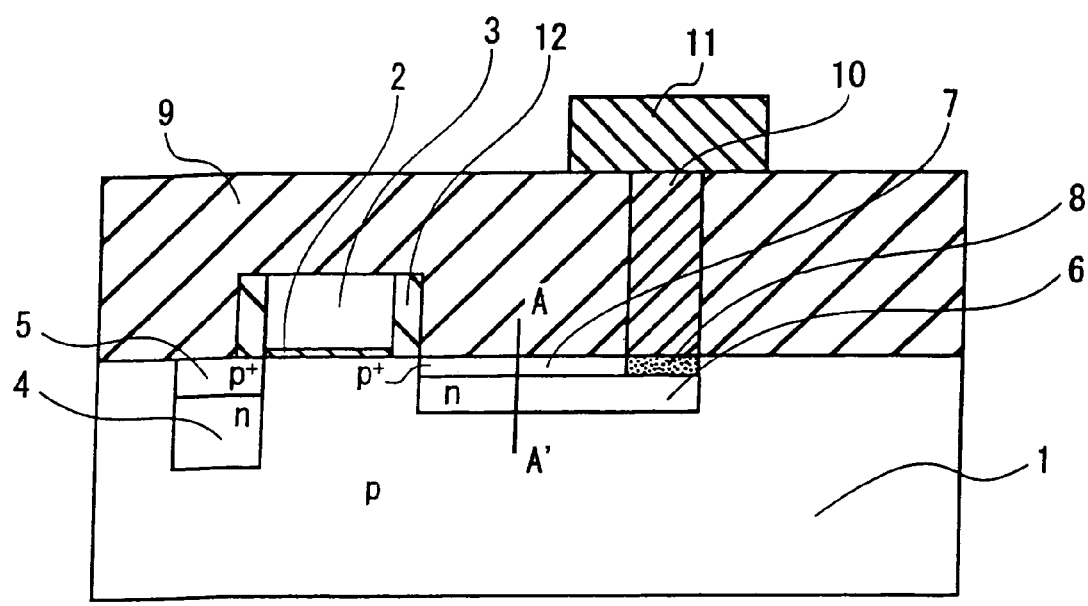
FIG. 1 is a cross sectional view of a semiconductor device according to an embodiment of the present invention.

Referring now to the drawings, wherein like reference numerals designate identical or corresponding parts throughout the several views, and more particularly to FIG. 1, a solid state image sensor is described according to a first embodiment of the present invention.

As shown in FIG. 1, a p-type well 1 is formed on a semiconductor substrate (not shown in FIG. 1) and a gate electrode 3 is provided on a surface of the p-type well 1 via a gate insulator 2. A sidewall 12, which is made of an insulator such as SiO2 or SiN, is formed on the surface of the p-type well 1 and covers partially the gate electrode 3. The sidewall 12 self-aligns with the gate electrode 3 and the gate insulator 2. An impurity concentration of the p-type well 1 is about $1 \times 10^{14}$ to $1 \times 10^{17}$ cm$^{-3}$.

A photoelectric conversion region 4 can be formed on one side (for example the left hand side in FIG. 1) of the gate insulator 2 and the gate electrode 3, and the photoelectric conversion region 4 generates a photo-current charge when it receives light. The charges are stored in the p-type well 1. The photoelectric conversion region 4 can be an n-type impurity region. An impurity concentration of the photoelectric conversion region 4 is about $1 \times 10^{15}$ to $1 \times 10^{18}$ cm$^{-3}$. The photoelectric conversion region 4 can be formed away from the surface of the p-type well 1, i.e., completely surrounded by the p-type well 1. By providing the photoelectric conversion region 4 apart from the surface of the p-type well 1, an amount of the crystal defects and surface states, which are formed in the p-type well 1 when the well is manufactured and also when various layers are formed on the p-type well 1, is reduced. Because of the reduced amount of crystal defects and surface states, an amount of electrical charges that are trapped by the crystal defects and surface states is also reduced, which determines an improved performance of the photoelectric conversion region 4, and of the image sensor as a whole. Thus, a signal/noise ratio of the semiconductor device having the above described structure is increased, resulting in the semiconductor device having an improved performance. The present embodiment discloses an amplifying MOS image sensor but the structure disclosed with regard to the image sensor is applicable to other semiconductor devices that have a structure similar to the image sensor. For example, a MOSFET transistor can be formed to have the drain and/or source formed completely within the p-type well, apart from the surface of the well.

Thus, the formation of the drain or source regions in the MOSFET transistor, away from the surface of the p-type well produces similar advantages as in the case of the image sensor, by preventing a leaking current that occurs in the drain or source regions of a conventional device when electric charges are trapped in the crystal defects and/or surface states.

A surface shield region 5 can be formed on the photoelectric conversion region 4, in the p-type well 1, to further reduce the leak current from or into the photoelectric conversion region 4. The surface shield region 5 can be a p-type semiconductor region in which boron (B) can be implanted as an impurity. The impurity of the surface shield region 5 is about $1 \times 10^{15}$ to $1 \times 10^{19}$ cm$^{-3}$. Thus, the surface shield region 5 prevents a current from the conversion region 4 entering the region of the p-type well above the drain region 6 and then entering a drain region 6, in effect directed the current from the conversion region 4 to the drain region 6 through a channel region formed underneath the gate electrode 2.

On the other side (right hand side in FIG. 1) of the gate insulator 2 and the gate electrode 3, the drain region 6 is formed in the p-type well 1. The drain region 6 can be formed apart from the surface of the p-type well 1, i.e., within the p-type well 1. A distance from the surface of the p-type well 1 to the drain region 6 is preset. As an example, the thickness of the drain region 6 is 0.1 micrometers. As another example, the drain region 6 can be formed 0.1 micrometers apart (deep) from the surface of the p-type well 1. The drain region 6 can have an impurity as phosphorus (P) with an impurity concentration about $1 \times 10^{16}$ to $1 \times 10^{20}$ cm$^{-3}$. The charges which are stored in the photoelectric conversion region 4 are transferred to the drain region 6 by driving the gate electrode 3 with an appropriate voltage.

The drain region 6 self-aligns to the sidewall 12 as shown in FIG. 1. However, an offset is provided between the edges of the drain region 6 and of the gate electrode 3. The width of the offset is comparable to, preferable equal to, the width of the sidewall 12.

An interlayer dielectric 9 is formed on the p-type well 1 to cover the drain shield region 5, the sidewall 12, and the gate electrode 3. The surface state defects are formed on the surface of the p-type well 1 when the interlayer dielectric layer 9 is formed. Since the surface of the p-type well 1 tends to be damaged during manufacturing, also the density of crystal defects on and near the surface of the p-type well 1 is high.

The density of crystal defects on and near the surface of the p-type well 1 is higher than for a region which is apart, in a depth direction of the well, from the surface of the p-type well 1. In other words, the farther (deeper) a region is from the surface of the p-type well 1, the lower the density of the crystal defects.

Thus, the drain region 6 is provided within the p-type well 1, apart from the surface and an immediate vicinity of the surface of the p-type well 1. The region where the drain region 6 is formed has a density of the surface states and the crystal defects lower than the surface of the p-type well 1. In other words, the drain region 6 is provided in the region inside the p-type well where the density of crystal defects is low. Thus, it is less likely that charges from the photoelectric conversion region 4 are trapped by the surface states or the crystal defects, which results in a reduction of a leak current that occurs from or into the drain region 6.

Furthermore, a drain shield region 7 can be formed in the surface part of the p-type well 1, between the drain region 6 and the surface of the p-type well 1. The drain shield region 7 can have a p+ conductivity, and can have the boron (B) implanted as an impurity. The drain shield region 7 with the above structure prevents a current from the conversion region 4 arriving at the drain region 6 from above the drain region 6. Thus, the leak current is further reduced. The concentration of the impurity in the drain shield region 7 is about $1 \times 10^{16}$ to $1 \times 10^{20}$ cm$^{-3}$, which is no less than that of the p-type well 1. The drain shield region 7 self-aligns to the sidewall 12.

The drain shield region 7 increases an electric potential barrier between the drain shield region 7 and the drain region 6, and thus, charges transferred to the drain region 6 are less likely to be trapped by the crystal defects which are formed on the surface or an immediate vicinity of the p-type well 1.

A contact region 8 is formed in a surface part of the p-type well 1 to contact the drain region 6 and the drain shield region 7. An impurity concentration of the contact region 8 can be about $1 \times 10^{16}$ to $1 \times 10^{19}$ cm$^{-3}$, which is similar to the impurity concentration of the drain region 6. One function of the contact region 8 is to connect the drain region 6 and a plug 10, which will be discussed later in more details. The contact region 8 contacts at least the drain region 6 and the plug 10. The contact region 8 has an upper surface either flush with, or at a different level than the upper surface of the p-type well.

The plug 10 is formed on the contact region 8 and a wiring 11 is formed to electrically connect to the plug 10.

Figure 2:
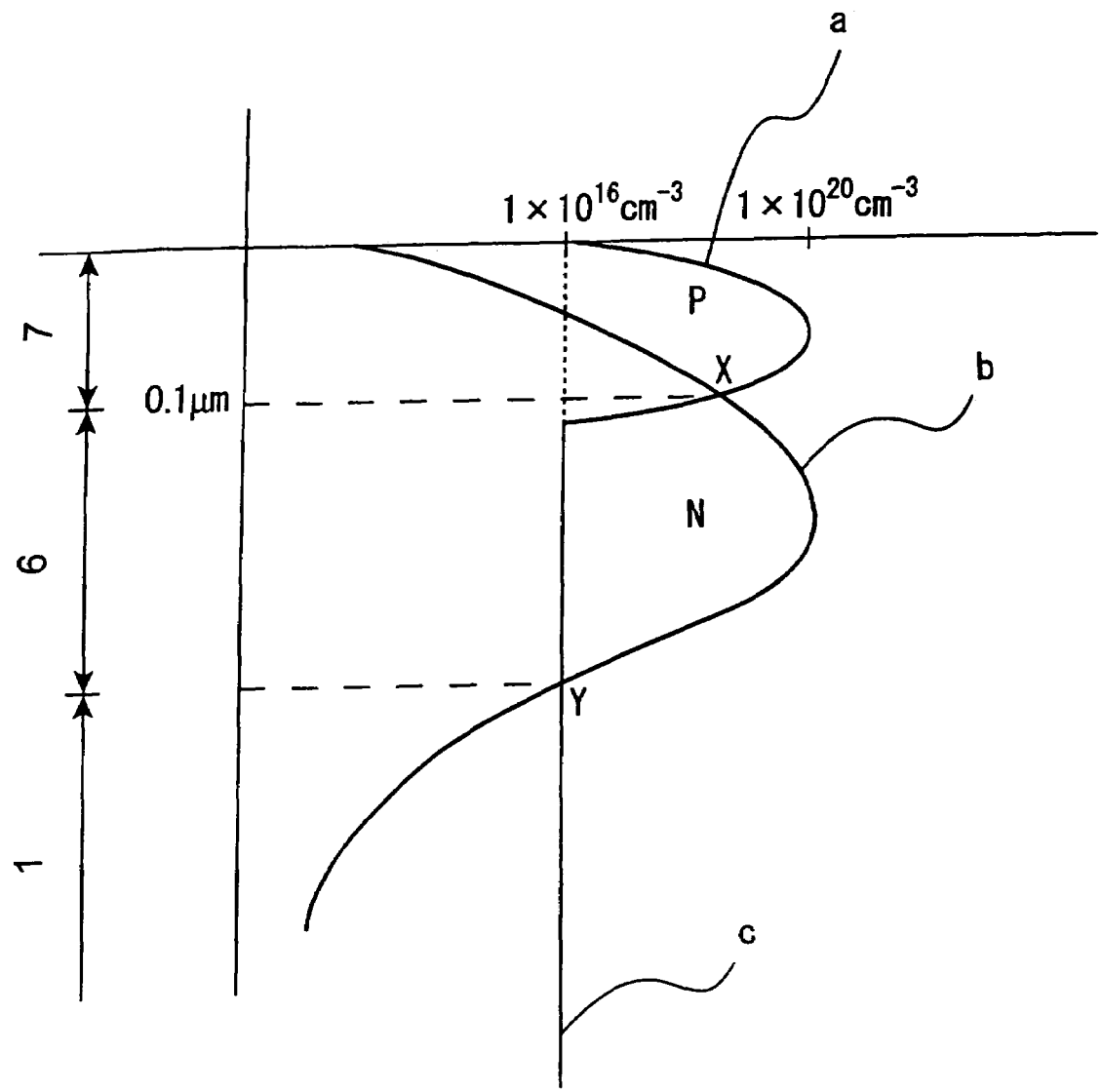
FIG. 2 illustrates a graph showing an impurity concentration profile in a depth direction of a drain region of the semiconductor device according to the embodiment of the present invention.

The position of the drain region 6 in the p-type well 1 will be explained in connection with impurities of various layers with reference to FIG. 2. FIG. 2 shows a graphic of an impurity concentration profile for various depths in the p-type well 1 and for various layers of the solid state image sensor of the present embodiment. FIG. 2 shows the impurity concentration profile taken along an A-A' line shown in FIG. 1. The horizontal axis of FIG. 2 represents the concentration of an impurity and the vertical axis represents a depth of various layers from the surface of the p-type well 1.

Curve "a" in FIG. 2 represents the impurity concentration of the p-type impurity such as boron (B), implanted into the p-type well 1, curve "b" represents the impurity concentration of the n-type impurity such as phosphorus (P), implanted into the p-type well 1, under the region implanted with the p-type impurity, and curve "c" represents the impurity concentration of the p-type well 1 elsewhere. FIG. 2 illustrates the case when the drain region 6 is provided 0.1 micrometers apart (deep) from the upper surface of the p-type well 1.

The drain shield region 7 is formed by implanting the p-type impurity into a corresponding part of the p-type well 1, and the drain region 6 is formed by implanting the n-type impurity into a corresponding part of the p-type well 1, as discussed above.

The p-type impurity of the drain shield region 7 is implanted such that a peak (peak of curve "a") of the impurity concentration is positioned under the surface of the p-type well 1. The n-type impurity in the drain region 6 is implanted such that a peak (peak or curve "b") of the impurity concentration is positioned deeper than the peak of the implanted p-type impurity of the drain region shield region 7.

The region where the impurity concentration of the n-type impurity (curve b) is equal to the impurity concentration of the p-type impurity (curve a) defines one boundary of the drain region 6, and the region where the impurity concentration of the n-type impurity (curve b) is equal to the impurity concentration of the p-type impurity (curve c) defines another boundary of the drain region 6. Further, in a surface part of the p-type well 1, above the drain region 6, the impurity concentration of the p-type impurity is higher than the n-type impurity, and that surface part of the p-type well 1 defines the p+-type drain shield region 7. In other words, an intersection X of the curve "a" and curve "b" in FIG. 2 defines the boundary between the drain region 6 and the drain shield region 7, and the intersection X also defines the upper edge of the drain region 6. An intersection Y of the curve "b" and curve "c" in FIG. 2 defines the boundary between the drain region 6 and the p-type well 1, and the intersection Y also defines the bottom edge of the drain region 6.

In this embodiment, the drain shield region 7, having a reverse conductivity type relative to the conductivity type of the drain region, is provided in the upper part of the drain region 6. Further, the upper edge of the drain region 6 is formed apart from the surface of the p-type well 1, i.e., the drain region 6 is away from the upper surface of the p-type well 1.

In the solid state image sensor according to the present embodiment, the whole drain region 6 is provided apart from any surface of the p-type well 1. The drain region 6 is provided inside the p-type well 1, in a region where the density of the surface states or crystal defects is lower than in the surface of the p-type well, such that it is less likely for the charges from the photoelectric conversion region to be trapped by the surface state or crystal defects. This feature of the drain region 6 advantageously reduces a leak current that can occur from or into the drain region.

Furthermore, in the solid state image sensor according to the present embodiment, the drain shield region 7 makes the potential barrier between the drain shield region 7 and the drain region 6 larger than a barrier in a conventional device. This enlarged potential barrier reduces the amount of charges which are transferred to the drain region 6, by making less likely the charges to be trapped in the crystal defects which are formed on the surface or close to the surface of the p-type well 1. Therefore, the location of the drain shield region also contributes to reducing the leak current from or into the drain region.

Moreover, the S/N ratio (signal/noise ratio) of the solid state image sensor of the present embodiment is improved. Because the charges are less likely to be trapped by the surface states or crystal defects, the stored charges in the photoelectric conversion region 4 are easier to be discharged, which improves the S/N ratio of the image sensor.

In addition, the sidewall 12 can be formed during the process of manufacturing the drain region 6 and the drain shield region 7 such that the drain region 6 and the drain shield region 7 are formed offset with a predetermined distance (corresponding to the width of the sidewall) from the gate electrode 3. Thus, the sidewall 12 can be removed after forming the drain region 6 and the drain shield region 7 in the manufacturing process.

A manufacturing process of the solid state image sensor of the first embodiment will be explained with reference to FIG. 3A-3F. The manufacturing process for a MOSFET transistor having the drain/source regions formed within the semiconductor substrate (a p-type or a n-type well), i.e., formed away from a surface of the semiconductor substrate, is similar to the present manufacturing process of the solid state image sensor. FIGS. 3A-3F are cross sectional views of the solid state image sensor manufactured according to the first embodiment of the present invention.

Figure 3A:
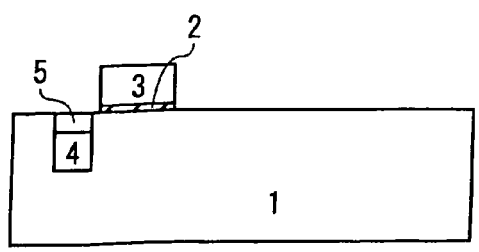
FIGS. 3A-3F are cross sectional views of the semiconductor device fabricated according to another embodiment of the present invention.

As shown in FIG. 3A, an n-type photoelectric conversion region 4 is formed in the p-type well 1. The photoelectric conversion region 4 can function as a cathode of a photo diode or can function as a drain region of a transistor. If the photoelectric conversion region 4 functions as the cathode, the region generates electrical charges when it receives light. The p+-type surface shield 5 is formed in the upper part of the photoelectric conversion region 4, and the gate insulator 2 and the gate electrode 3 are formed on the p-type well 1, next to the photoelectric conversion region 4. The photoelectric conversion region 4, the surface shield 5, the gate insulator 2, and the gate electrode 3 are formed according to the methods known by one of ordinary skill in the art.

Figure 3D:
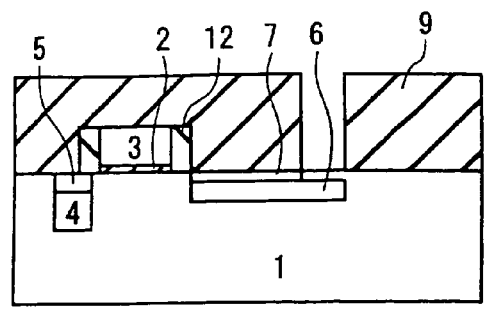
Figure 3B:
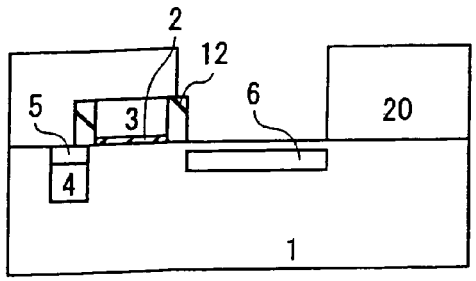

As shown in FIG. 3B, the sidewall 12, which self-aligns to the gate electrode 3 and the gate insulator 2, is formed on the surface of the p-type well 1. Next, a resist pattern 20 is formed on the p-type well 1. The resist pattern 20 has openings through which a lateral part of the sidewall 12 and a surface part of the p-type well 1 are exposed. The n-type drain region 6, which self-aligns to the sidewall 12, is formed by implanting, for example phosphorus (P), into the p-type well 1 surface exposed from the openings of the resist pattern 20 while the resist pattern 20 is used as a mask.

The impurity concentration profile of the curve "b" of FIG. 1 is obtained by an ion implanting condition where the phosphorus (P) is used as the implanting ion and an energy of the ion beam is 100 Kev with a dose of $1 \times 10^{13}$ to $1 \times 10^{14}$ cm$^{-3}$.

Figure 3E:
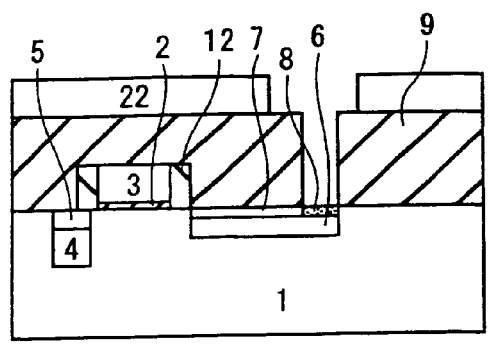
Figure 3C:
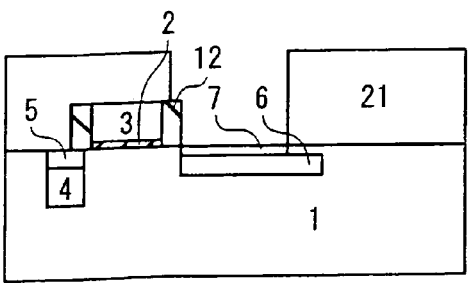

As shown in FIG. 3C, after the resist pattern 20 is removed, another resist pattern 21 is formed on the p-type well 1. The resist pattern 21 has openings that expose an upper part of the p-type well 1 that is above the drain region 6. The p+-type drain shield region 7, which self-aligns to the sidewall 12, is formed on an upper part of the drain region 6 by implanting boron (B) into a portion of the p-type well 1 that is formed above the drain region 6, while the resist pattern 21 is used as a mask. In other words, the part of the p-type well 1 that was implanted with P for example, when the drain region 6 was formed, is further implanted with B, for example, thus becoming the drain shield region 7.

The impurity concentration profile of the curve "a" of FIG. 2 is obtained by another ion implanting condition where the boron (B) is used as the implanting ion and an energy of the ion beam is 10-30 KeV with a dose of $1 \times 10^{13}$ to $1 \times 10^{14}$ cm$^{-3}$.

As shown in FIG. 3D, after the resist pattern 21 is removed, an interlayer dielectric 9 is deposited on the p-type well 1. Openings are formed in the interlayer dielectric 9 and the openings of the interlayer dielectric 9 expose a part of the p-type well 1, corresponding to the drain region 6. However, the openings in the interlayer dielectric 9 do not expose the drain shield region 7. That is, the openings in the resist layer 21 in the previous step has a cross section smaller than a cross section of the drain region in a plane parallel to the surface of the p-type well 1, and thus a region of the p-type well 1 formed above the drain region 6 has not been ion implanted with B. That region is now exposed in the openings of the interlayer dielectric 9.

As shown in FIG. 3E, a resist pattern 22 is deposited on the interlayer dielectric 9 and phosphorus (P) is implanted into a surface part of the p-type well 1, corresponding to the drain region 6 but not to the drain shield 7 to form a contact 8, which contacts the drain region 6.

Figure 3F:
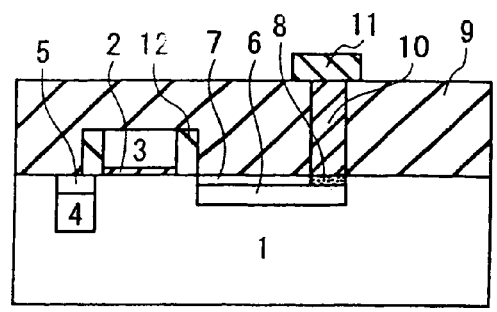

As shown in FIG. 3F, after the resist pattern 22 is removed, a plug 10 is formed by W-CVD to fill the opening of the interlayer dielectric 9 and to contact the contact 8. After that, a wiring 11 is formed on the plug 10.

Figure 4:
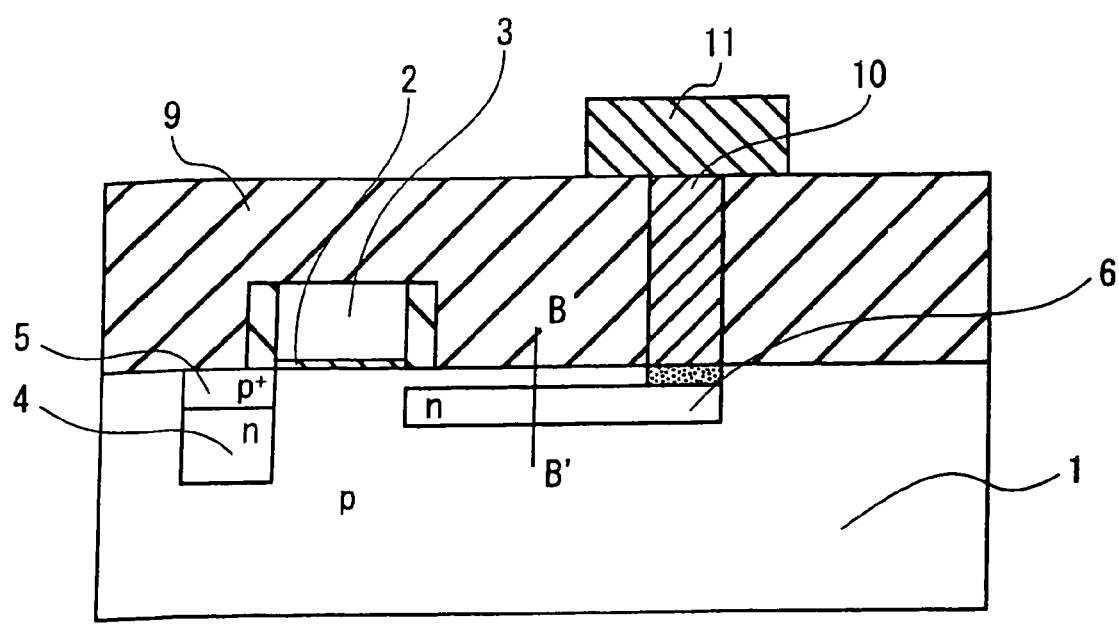
FIG. 4 is a cross sectional view of a semiconductor device according to still another embodiment of the present invention.

According to a second embodiment of the present invention, as will be explained with reference to FIG. 4 and FIG. 5, a semiconductor device having the drain region positioned differently than the drain region of the semiconductor of the first embodiment is discussed. As also discussed above, the semiconductor device could be a solid state image sensor, a transistor, or other similar devices. Further, p-type well can be a first semiconductor layer and the drain and photoelectric conversion regions can be a pair of second semiconductor layers. However, for exemplification only, the present embodiment is discussed with reference to a solid state image sensor. Thus, FIG. 4 shows a cross sectional view of the solid state image sensor according to the second embodiment of the present invention.

With respect to each portion of the image sensor of the second embodiment, the same element of the solid state image sensor of the first embodiment shown in FIG. 1 to FIG. 3F is designated by the same reference numeral, and the explanation of that element is omitted. FIG. 4 shows that the solid state image sensor of the second embodiment does not have a drain shield region as the image sensor of the first embodiment. In other words, the region of the p-type well 1, above the drain region 6, is not implanted with a second impurity as in the previous embodiment.

The position of the drain region 6 of the image sensor of the present embodiment in the p-type well 1 will be explained with reference to FIG. 5 hereinafter. FIG. 5 shows various curves that correspond to an impurity concentration profile in a depth direction of the drain region. FIG. 5 shows the impurity concentration profile taken along the B-B' line shown in FIG. 4. The curve "d" in FIG. 5 represents the impurity concentration of the implanted n-type impurity, such as phosphorus (P), into a region of the p-type well to form the drain region 6. The curve "e" in FIG. 5 represents the impurity concentration of the p-type well 1. The drain region 6 is shown in FIG. 5 as being apart about 0.1 micrometers from the surface of the p-type well 1.

The p-type well 1 is implanted with a p-type impurity, phosphorous for example, concentration of about $1 \times 10^{16}$ cm$^{-3}$. Then, the drain region is formed by implanting an n-type impurity, boron for example, only in the region of the p-type well where the drain region is to be formed.

Figure 5:
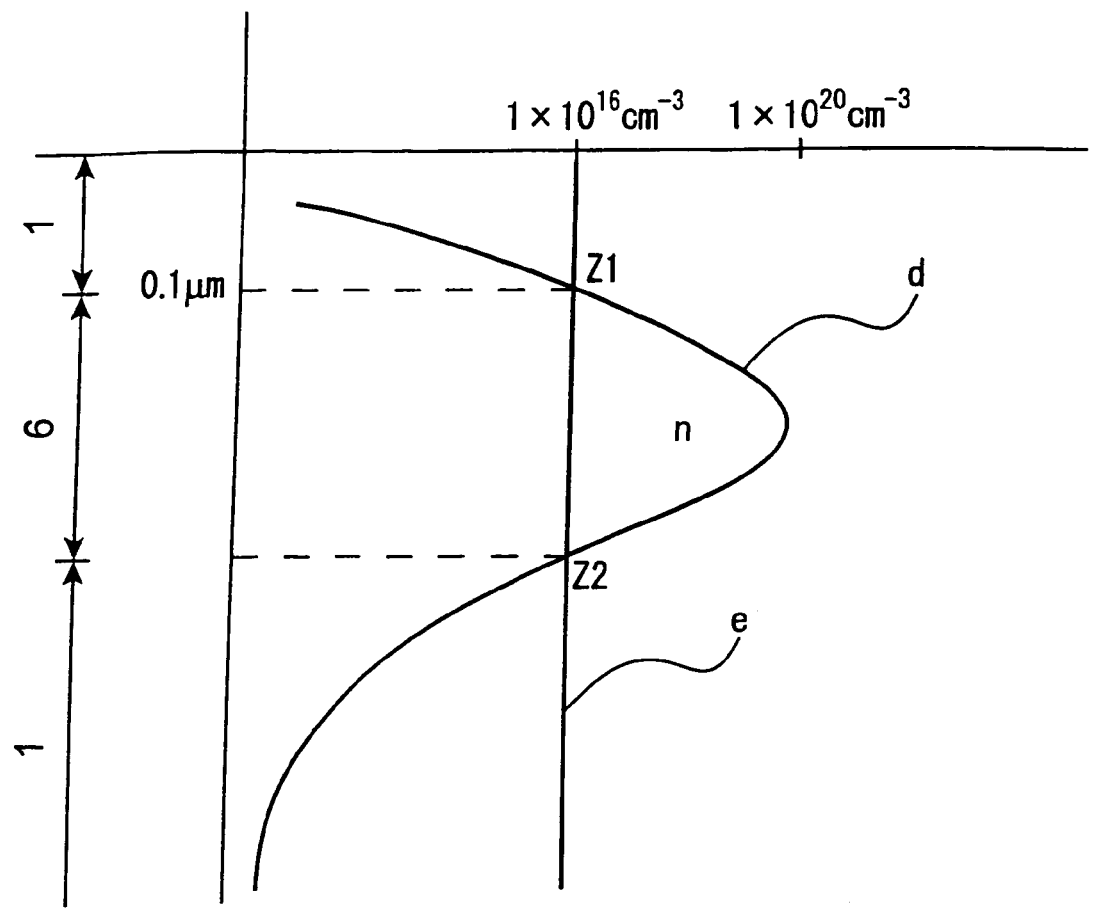
FIG. 5 illustrates a graph showing an impurity concentration profile of the semiconductor device of FIG. 4.

The n-type impurity is implanted into a region of the p-type well 1, such that a peak of the impurity concentration profile is positioned apart from the surface of p-type well 1, as shown in FIG. 5. The peak of the impurity concentration can be about $1 \times 10^{20}$ cm$^{-3}$.

The region in the p-type well 1 where the impurity concentration of the n-type impurity is higher than that of the p-type defines the drain region 6. However, both above and below the drain region 6, regions of the p-type well 1 have an impurity concentration of the p-type impurity higher than that of the n-type. In other words, the surface part of p-type well 1 remains a part of the p-type well 1 after the drain region 6 is formed by ion implantation, i.e., the drain region 6 is completely enclosed by the p-type well. Thus, an intersection Z1 of the curve "d" and the curve "e" in FIG. 5 represents the upper boundary between the drain region 6 and the p-type well 1, and the intersection Z1 corresponds to the upper edge of the drain region 6. An intersection Z2 of the curve "d" and the curve "e" in FIG. 5 represents the lower boundary between the drain region 6 and the p-type well 1, and the intersection Z2 corresponds to the bottom edge of the drain region 6.

In the solid state image sensor according to the present embodiment, the drain region 6 is provided apart from the surface of the p-type well 1, in a depth direction of the well, in a region where the density of the surface states or crystal defects is lower than in the surface of the p-type well. Because the charges from the photoelectric conversion region are less likely to be trapped by the reduced number of surface states or crystal defects, a leak current that can occur from or into the drain region is consequently reduced.

Moreover, the S/N ratio (signal/noise ratio) of the semiconductor device according to the present embodiment is improved because the charges are less likely to be trapped by the surface states or crystal defects, and thus the stored charges in the photoelectric conversion region 4 are easier to be discharged.

The S/N ratio of the semiconductor device of the present embodiment is improved even though the drain shield region is not provided as in the semiconductor device of the previous embodiment.

Figure 6:
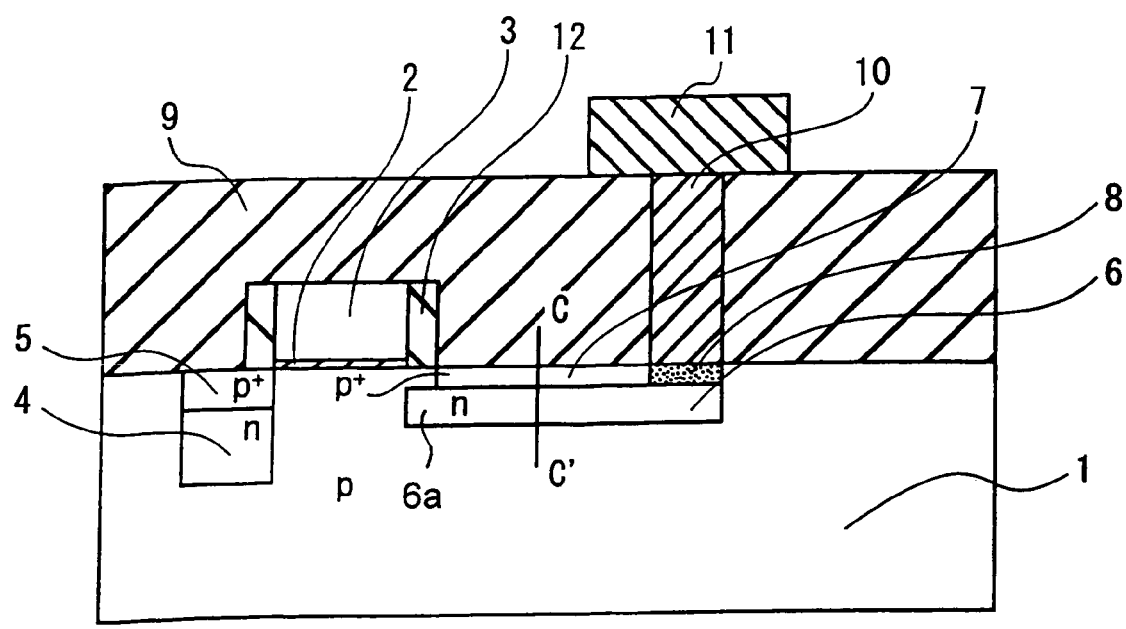
FIG. 6 is a cross sectional view of a semiconductor device according to another embodiment of the present invention.

A third embodiment of the present invention will be explained with reference to FIG. 6 and FIG. 7. FIG. 6 is a cross sectional view of a solid state image sensor that has the drain region different than the devices shown in the previous embodiments.

With respect to each portion of the image sensor of the third embodiment, the same element of the solid state image sensor of the first or second embodiment shown in FIG. 1 to FIG. 5 is designated by the same reference numeral, and its explanation is omitted in the present embodiment. Comparing the image sensor of the present embodiment to the image sensor of the first embodiment, the image sensor of the present embodiment has an extended drain region 6a that belongs to the drain region 6, extending toward the conversion region 4 from the drain region, within the p-type well 1, as shown in FIG. 6. In another embodiment, a transistor can have the structure shown in FIG. 6. More specifically, the transistor can have a first semiconductor region 1 having a first conductivity type, second and third semiconductor regions (4 and 6) having a second conductivity type formed in the first semiconductor region 1, the second and third semiconductor regions being separated from each other by a portion of the first semiconductor region serving as a channel region. In addition, the transistor can include an insulator layer 2 provided on a surface of the first semiconductor region 1 in contact with the channel region and a gate electrode 3 provided on the insulator layer 2. Further, the first semiconductor region 1 includes a shield semiconductor region 7 of the first conductivity type disposed between the surface of the first semiconductor region 1 and at least one of the second and third semiconductor regions 4 and 6 such that the at least one of the second and third semiconductor regions is sandwiched between the shield region 7 and the first semiconductor region 1.

The transistor can also include first and second shield regions 5 and 7, respectively, of the first conductivity type disposed between the surface of the first semiconductor region 1 and the second and third semiconductor regions 4 and 6, respectively, such that the second and third semiconductor regions are sandwiched between respective first and second shield regions 5 and 7 and the first semiconductor region 1.

The transistor can also include an insulating sidewall 12 formed on at least one side part of the gate electrode 2 and one of the second and third semiconductor regions 4 and 6 having a side part vertically aligned with the at least one side part of the gate electrode beneath the sidewall.

Figure 8:
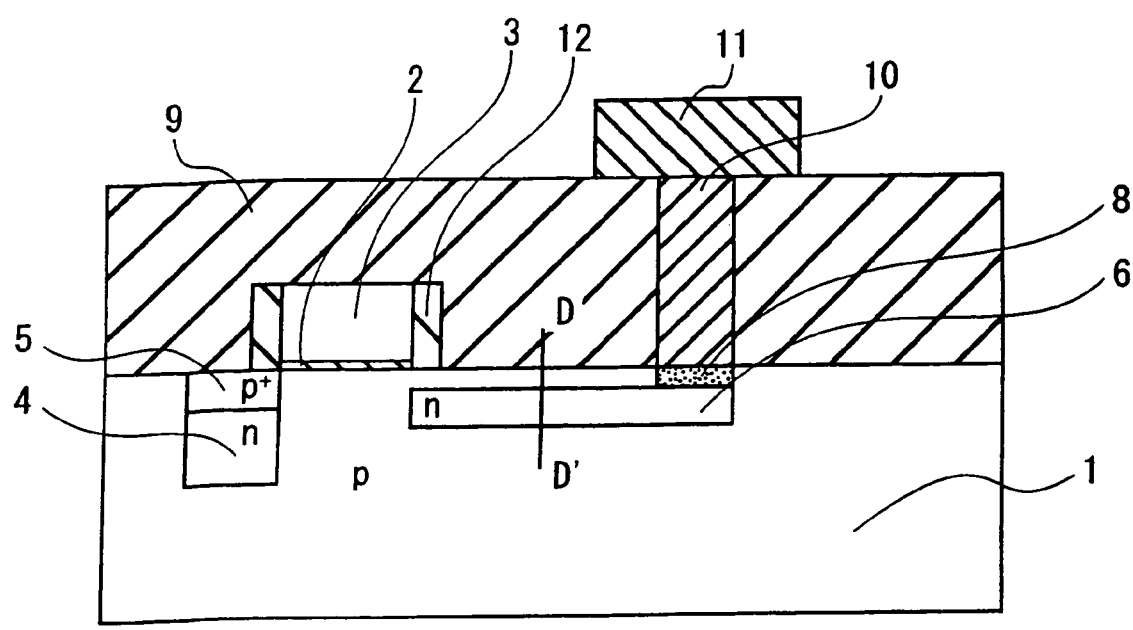
FIG. 8 is a cross sectional view of a semiconductor device according to another embodiment of the present invention.
Figure 9:
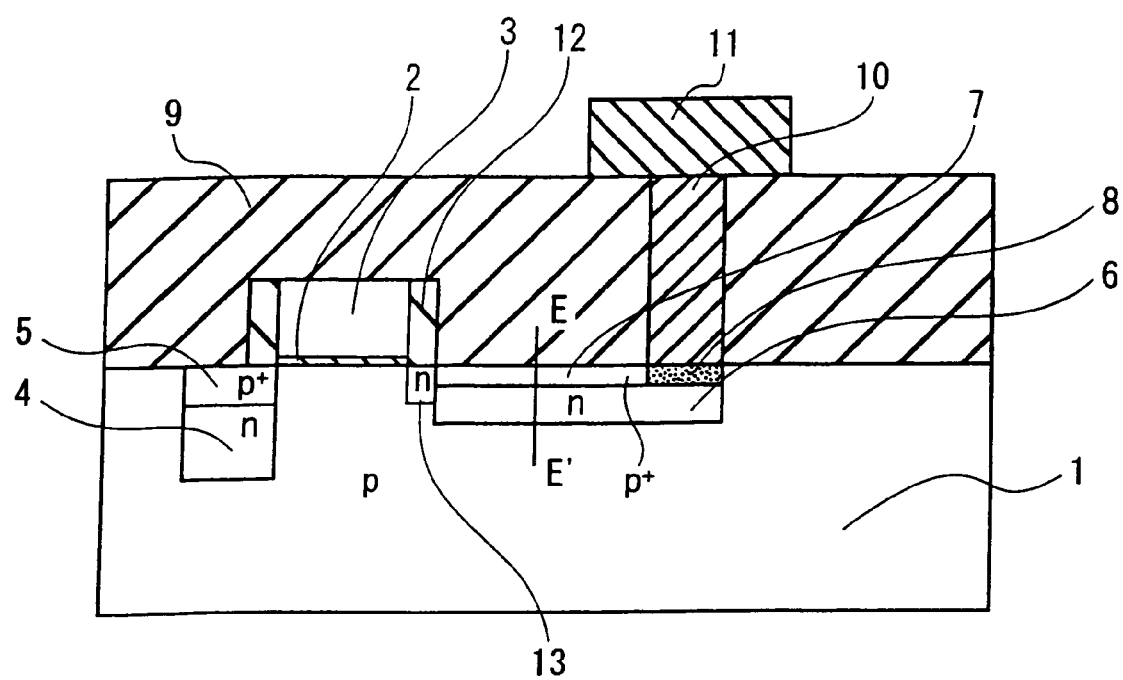
FIG. 9 is a cross sectional view of a semiconductor device according to anther embodiment of the present invention.

The transistor can have at least one impurity region 13 as shown in FIG. 9, of the second conductivity type formed in the first semiconductor region 1 between the channel region and the at least one shield region 7, the impurity region 13 extending from the surface of the first semiconductor layer 1 towards the at least one of the second and third semiconductor regions 4 and 6. The transistor can have other elements as shown in FIGS. 1-5 and 8-11.

The impurity concentration profile in a depth direction along the drain region, taken along the C-C' line in FIG. 6, for either the image sensor or the transistor, is similar to the impurity concentration profile of the image sensor of first embodiment, shown in FIG. 2. Thus, the explanation of the impurity concentration profile is omitted in the present embodiment.

As shown in FIG. 6, the drain region 6, which self-aligns with the gate electrode 3, is formed at a predetermined depth apart from the upper surface of the p-type well 1, as discussed above with reference to FIG. 1. The drain shield region 7, which self-aligns to the sidewall 12, is formed in a surface part of the p-type well 1. The drain region 6 has an extended part 6a, which is not covered by the drain shield region 7. Thus, the extended part 6a of the drain region 6 extends under the sidewall 12, within the p-type well 1.

Accordingly, charges from the photoelectric conversion region 4 are transferred to the drain region 6, via the p-type well 1, formed under the gate electrode 3, and the extended part 6a of the drain region 6.

The extended region 6a makes the potential barrier, between a region of the p-type well 1 under the gate electrode 3 and the drain region 6 smaller, so charges are transferred from the photoelectric conversion region 4 to the drain region 6 more easily than in a conventional device that does not have the extended region 6a. Also, the extended drain region 6a enhances a current between the conversion region 4 and the drain region 6.

The drain shield region 7 is formed on the drain region 6 but not on the extended part 6a of the drain region 6. If the drain shield region 7 is formed near the gate electrode 3, the drain shield region 7 increases a potential barrier, and the barrier would make less likely a transfer of charges to the drain region 6. For this reason, the drain shield region 7 is not formed on the extended part 6a of the extended drain region 6. Because the drain region 6 is extended toward the gate electrode 3, the transfer of charges to the drain region 6 from the photoelectric conversion region 4 is easier than in the semiconductor device of the first embodiment.

In the present embodiment, as shown in FIG. 6, the side edge of the extended region 6a and the side edge of the gate electrode 3 can coincide. However, the two edges can be located to not coincide. The extended part 6a is formed by implanting slantingly impurities into that part or by annealing the semiconductor device to diffuse an impurity of the drain region 6a to a lateral direction. Because of the extended part 6a of the drain region 6, according to the present embodiment, charges are discharged more likely from the photoelectric conversion region to the drain region than in a conventional image sensor.

In the solid state image sensor according to this embodiment, because the drain region 6 is provided in the region where the density of the surface state or crystal defects is lower than in the surface of the p-type well, the charges from the photoelectric conversion region are less likely to be trapped by the surface state or crystal defects, thus reducing a leak current that can occur from or into the drain region.

Further, in the solid state image sensor according to this embodiment, because the drain shield region 7 is provided in an upper part of the drain region 6 and in the p-type well 1, the potential barrier between the drain shield region 7 and the drain region 6 becomes larger than in a conventional device. This enlarged potential barrier makes the charges transferred to the drain region 6 less likely to be trapped by the crystal defects formed on the surface or close to the surface of the p-type well 1, above the drain region 6. Therefore, a leak current that can occur from or into the drain region is further reduced.

Moreover, the S/N ratio (signal/noise ratio) of the semiconductor device of the present embodiment is improved because the charges are less likely to be trapped by the surface state or the crystal defects, and the stored charges in the photoelectric conversion region 4 are easier to be discharged through a channel region to the drain region.

In addition, because the drain region 6 extends toward the gate electrode 3, under the p-type well 1, the charges stored in the photoelectric conversion region 4 are further facilitated to be discharged to the drain region 6 through the channel region and not through the p-type well 1.

Another advantage of the image sensor of the present embodiment is that the drain shield region 7 is not provided on the extended part 6a of the drain region 6, and such the charges are transferred from the photoelectric conversion region 4 to the drain region 6 via the extended part 6a easier than without the extended part 6a.

In addition, the sidewall 12 is formed in the process of manufacturing the drain region 6 and the drain shield region 7, such that the drain region 6 and the drain shield region 7 are separated by a predetermined distance (corresponding to the width of the sidewall) from the gate electrode 3. Thus, the sidewall 12 can be removed after forming the drain region 6 and the drain shield region 7 in the manufacturing process.

A manufacturing process of the solid state image sensor of the third embodiment will be explained with reference to FIGS. 7A-7F. FIGS. 7A-7F are cross sectional views of the solid state image sensor manufactured according to the third embodiment.

Figure 7A:
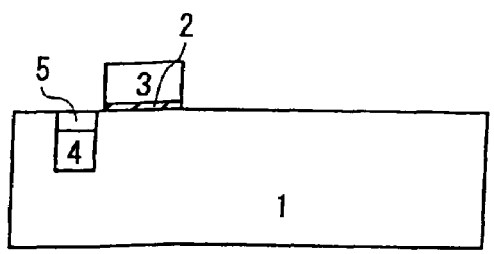
FIGS. 7A-7F are cross sectional views of a semiconductor device fabricated according to another embodiment of the present invention.

As shown in FIG. 7A, the n-type photoelectric conversion region 4 is formed in the p-type well 1. The photoelectric conversion region 4 functions as a cathode of a photo diode, or as a drain/source region of a transistor. When the conversion region 4 function as the cathode of the photo diode, the conversion region generates electrical charges when receives light. The p+-type surface shield 5 is formed in an upper part of the photoelectric conversion region 4, and the gate insulator 2 and the gate electrode 3 are formed on the p-type well 1, next to the surface shield 5. The photoelectric conversion region 4, the surface shield 5, the gate insulator 2, and the gate electrode 3 are formed according to the conventional processes know by one of ordinary skill in the art.

Figure 7D:
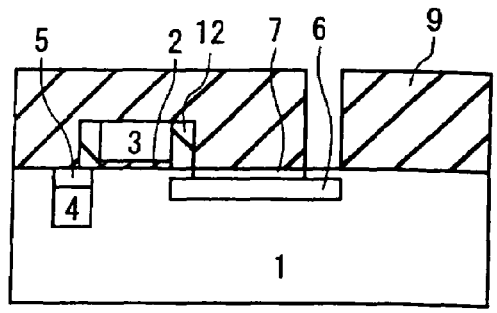
Figure 7B:
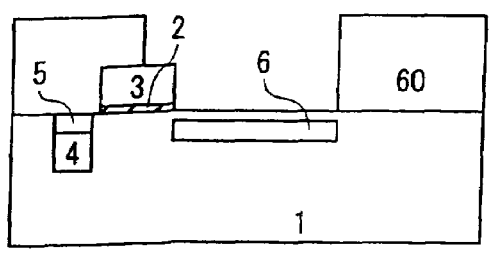

As shown in FIG. 7B, a resist pattern 60 is formed on the p-type well 1. The resist pattern 60 has openings which expose a lateral part of the gate electrode 3 and a surface part of the p-type well 1. The n-type drain region 6, which self-aligns to the gate electrode 3, is formed by implanting phosphorus (P) into the p-type well 1 while the resist pattern 60 functions as a mask.

An impurity profile (for the drain region) similar to curve "b" shown in FIG. 1 is obtained by an ion implanting condition where phosphorus (P) is used as the implanting ion and an energy of the ion beam is 100 KeV with a dose of $1\times10^{13}$ to $1\times10^{14} cm^{-3}$.

Figure 7E:
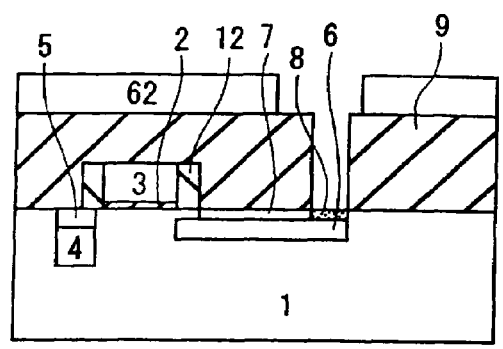
Figure 7C:
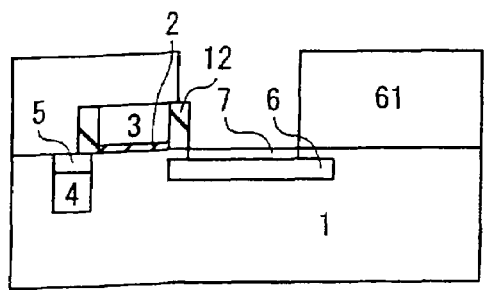

As shown in FIG. 7C, after the resist pattern 60 is removed, the sidewall 12, which self-aligns to the gate electrode 3 and the gate insulator 2, is formed on the surface of the p-type well 1. The sidewall 12 covers a part of the drain region 6. Next, another resist pattern 61 is formed on the on the p-type well 1. The resist pattern 61 has openings that correspond to an upper part of the drain region 6. The p+-type drain shield region 7, which self-aligns to the sidewall 12, is formed in an upper part of the drain region 6 by implanting boron (B) into the p-type well 1, while the resist pattern 61 is used as a mask.

An impurity profile (for the drain shield region) similar to curve "a" of FIG. 1 is obtained by an ion implanting condition where the boron (B) is used as the implanting ion and an energy of the ion beam is 10-30 KeV with a dose of $1\times10^{13}$ to $1\times10^{14} cm^{-3}$.

As shown in FIG. 7D, after the resist pattern 61 is removed, an interlayer dielectric 9 is deposited on the p-type well 1 such that at least an opening is formed in interlayer dielectric 9. The at least an opening expose a surface part of the p-type well 1, which corresponds to a region of the drain region 6. However, the at least an opening in the interlayer dielectric 9 does not correspond to the drain shield region 7.

As shown in FIG. 7E, a resist pattern 62 is deposited on the interlayer dielectric 9 and phosphorus (P) is implanted into the surface part of the p-type well 1 exposed by the opening to form the contact 8, which electrically contacts the drain region 6. The contact 8 may or may not be in direct contact to the drain shield region 7.

Figure 7F:
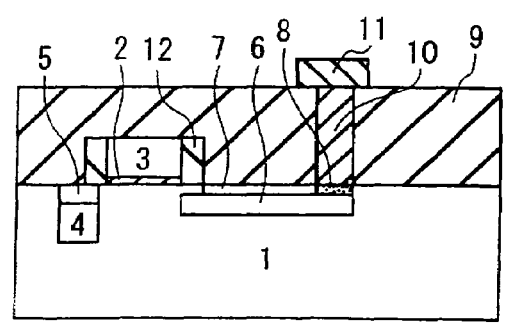

As shown in FIG. 7F, after the resist pattern 62 is removed, a plug 10 is formed by W-CVD to fill the opening in the interlayer dielectric 9 and to electrically contact the contact 8. After that, a wiring 11 is formed thereon, in contact with the plug 10.

A fourth embodiment of the present invention will be explained with reference to FIG. 8. FIG. 8 shows a cross sectional view of a solid state image sensor. As discussed above, the present invention is not limited to the solid state image sensor but can be applied to a MOSFET transistor, or any other semiconductor device known by one of ordinary skill in the art to have a similar structure as the solid state image sensor.

With respect to each element of the image sensor of the fourth embodiment, the same element of the solid state image sensor of the first, second and third embodiments shown in FIG. 1 to FIG. 7 is designated by the same reference numeral, and the explanation of that element is omitted. Comparing the image sensor of the present embodiment to the image sensor of the third embodiment, the solid state image sensor of the present embodiment does not have a drain shield region. In other words, the region of the p-type well 1 formed between the drain region 6 and the interlayer dielectric 9 is not implanted with impurities to form a corresponding drain shield region.

An impurity concentration profile in a depth direction of the drain region, taken along the D-D' line in FIG. 8, is similar to the impurity concentration profile of the image sensor of the second embodiment. Accordingly, the explanation of the impurity concentration profile is omitted.

In the solid state image sensor according to this embodiment, because the drain region 6 is provided in the region where the density of the surface state or crystal defects is lower than a region in the surface of the p-type well, the charges from the photoelectric conversion region are less likely to be trapped by the surface state or crystal defects, and thus a leak current that can occur from or into the drain region is reduced.

Moreover, the S/N ratio (signal/noise ratio) of the image sensor of the present embodiment is improved because the charges are less likely to be trapped by the surface state or crystal defects, and the charges stored in the photoelectric conversion region 4 are easier to be discharged.

Also, the charges stored in the photoelectric conversion region 4 are discharged more easily than in a conventional device because in the solid state image sensor of the present embodiment, the drain region 6 extends toward the p-type well 1, under the gate electrode 3.

In addition, the S/N ratio of the image sensor of the present embodiment is improved relative to a conventional device even though the image sensor of the present embodiment does not have the drain shield region.

A fifth embodiment of the present invention will be explained with reference to FIG. 9 and FIGS. 10A-10G. FIG. 9 is a cross sectional view of a solid state image sensor.

With respect to each element of the image sensor of this fifth embodiment, the same element of the solid state image sensor of the first, second, third or fourth embodiment shown in FIG. 1 to FIG. 8 is designated by the same reference numeral, and the explanation of that element is omitted. Comparing the image sensor of the present embodiment to the image sensor of the first embodiment, the solid state image sensor of the present embodiment has an n-type impurity region 13 which is formed near the gate electrode 3 and in contact with the drain region 6.

An impurity concentration profile in a depth direction of the drain region, taken along the E-E' line in FIG. 9, is similar to the impurity concentration profile of the image sensor of the first embodiment shown in FIG. 2. Thus, the explanation of the impurity concentration profile is omitted for this embodiment.

As shown in FIG. 9, the sidewall 12, which self-aligns to the gate electrode 3, is formed on the surface of the p-type well 1. The drain region 6, which self-aligns to the sidewall 12, is formed at a predetermined depth apart from the upper surface of the p-type well 1. The drain shield region 7, which self-aligns to the sidewall 12, is formed in the surface part of the p-type well 1, above the drain region 6, as discussed in the first embodiment. The drain shield region 7 does not cover the drain region 6 in its entirety.

In the p-type well 1, under the sidewall 12, the n-type impurity region 13, which self-aligns to the gate electrode 3, is formed in contact with the drain region 6 and to have a surface flush with the surface of the p-type well 1. An impurity concentration of the impurity region 13 is about $1 \times 10^{15}$ to $1 \times 10^{19} cm^{-3}$, which is similar to an impurity concentration of the drain region 6. The n-type impurity region 13 can be formed as deep as the drain region 6. However, FIG. 9 shows that the n-type impurity region 13 is not as deep as the drain region 6.

In the image sensor of the present embodiment, the charges are transferred from the photoelectric conversion region 4 to the drain region 6, via the p-type well 1, under the gate electrode 3 and the impurity region 13. The impurity region 13 blocks a current from the conversion region 4 to reach the drain shield region 7 and directs that current to the drain region 6.

Thus, the impurity region 13 makes the potential barrier between the p-type well 1, under the gate electrode 3, and the drain region 6 smaller, and thus the charges are transferred to the drain region 6 easier than in a conventional device.

If the impurity concentration of the impurity region 13 is smaller than that of the drain region 6, the field effect from the gate electrode 3, near the drain region 6, is reduced, thus enhancing the performance of the image sensor.

In the solid state image sensor according to this embodiment, because the drain region 6 is provided in the region where the density of the surface state or crystal defects is lower than a region in the surface of the p-type well, it is less likely for the charges from the photoelectric conversion region to be trapped by the surface state or crystal defects, and thus a leak current that can occur from or into the drain region is reduced.

Furthermore, in the solid state image sensor according to this embodiment, because the drain shield region 7 is provided in an upper part of the drain region 6 and in the p-type well 1, the drain shield region 7 makes the potential barrier between the drain shield region 7 and the drain region 6 larger. This enlarged potential barrier makes the charges transferred to the drain region 6 less likely to be trapped by the crystal defects, which are formed on the surface or close to the surface of the p-type well 1. Therefore, the leak current that can occur from or into the drain region is further reduced.

Moreover, the S/N ratio (signal/noise ratio) of the image sensor of the present embodiment is improved because the charges are less likely to be trapped by the surface state or crystal defects of the p-type well, and the charges stored in the photoelectric conversion region 4 are easier to be discharged.

In the solid state image sensor according to this embodiment, because the impurity region 13 is formed near the gate electrode 3, in the surface part of the p-type well 1, the charges stored in the photoelectric conversion region 4 are discharged easily to the drain region 6.

In addition, the sidewall 12 is formed in the process of manufacturing the drain region 6 and the drain shield region 7, which are separated by a predetermined distance (corresponding to the width of the sidewall) from the gate electrode 3, so that the sidewall 12 can be removed after forming the drain region 6 and the drain shield region 7 in the manufacturing process.

A manufacturing process of the solid state image sensor of the fifth embodiment will be explained with reference to FIGS. 10A-10G hereinafter. FIGS. 10A-10G represent cross sectional views of the solid state image sensor manufactured according to the fifth embodiment of the present invention.

Figure 10A:
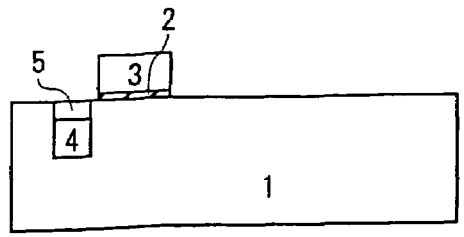
FIGS. 10A-10G are cross sectional views of a semiconductor device fabricated according to another embodiment of the present invention.

As shown in FIG. 10A, the n-type photoelectric conversion region 4 is formed in the p-type well 1. The photoelectric conversion region 4 functions as cathode of a photo diode, or as a drain/source of a semiconductor device as would be recognized by one of ordinary skill in the art. The photoelectric conversion region 4 generates charges when exposed to light. The p+-type surface shield 5 is formed on the upper part of the photoelectric conversion region 4, and the gate insulator 2 and the gate electrode 3 are formed on the p-type well 1, next to the surface shield 5. The photoelectric conversion region 4, the surface shield 5, the gate insulator 2, and the gate electrode 3 are formed in a manner known by one of ordinary skill in the art.

Figure 10B:
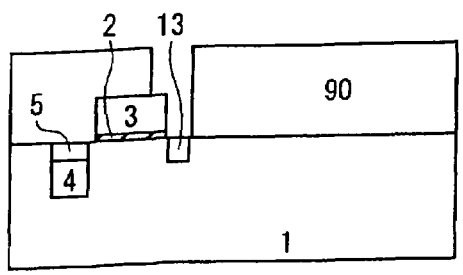

As shown in FIG. 10B, a resist pattern 90 is formed with openings on the p-type well 1. The openings are formed to expose a lateral part of the gate electrode 3, and a surface part of the p-type well 1. The n-type impurity region 13, which self-aligns to the gate electrode 3, is formed by implanting phosphorus (P) into the exposed surface part of the p-type well 1 while the resist pattern 90 functions as a mask.

Figure 10C:
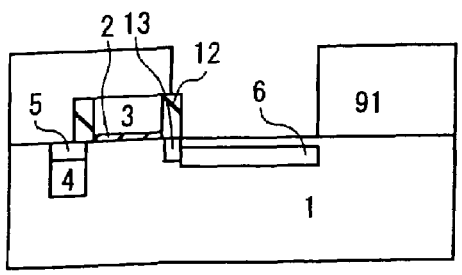

As shown in FIG. 10C, after the resist pattern 90 is removed, the sidewall 12, which self-aligns to the gate electrode 3 and the gate insulator 2, is formed on the surface of p-type well 1, in top of the n-type impurity region 13. The sidewall 12 can have the same width as the n-type impurity region 13. A depth formation of the n-type impurity region 13 is controlled by the energy of the ion implantation beam used to create the n-type impurity region 13. In another embodiment, a bottom surface of the n-type impurity region can have the same level as a bottom surface of the drain region 6. The n-type impurity region 13 is at least as deep as the drain shield layer 7 to block a current from the conversion region 4 to enter the drain shield layer 7. Next, a resist pattern 91 is formed on the surface of the p-type well 1. The resist pattern 91 has openings that expose an upper part of the drain region 6. The n-type drain region 6, which self-aligns to the sidewall 12 and contacts the impurity region 13, is formed by implanting phosphorus (P) into the p-type well 1 while the resist pattern 91 is used as a mask.

An impurity profile (of the drain region) similar to curve "b" shown in FIG. 2 is obtained by an ion implanting condition where the phosphorus (P) is used as the implanted ion and the energy of the ion beam is 100 KeV with a dose of $1 \times 10^{13}$ to $1 \times 10^{14} cm^{-3}$.

Figure 10D:
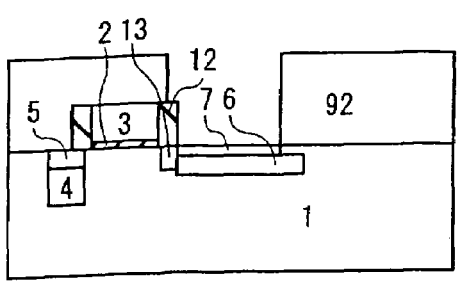

As shown in FIG. 10D, after the ion implantation, the resist pattern 91 is removed, and another resist pattern 92 is formed to cover the surface of the p-type well 1. The resist pattern 92 is formed to have openings that expose an upper part of the drain region 6. The p+-type drain shield region 7, which self-aligns to the sidewall 12, is formed in an upper part of the drain region 6 by implanting boron (B) into the upper region of the p-type well 1 that is above the drain region 6, while the resist pattern 92 is used as a mask.

An impurity profile (of the drain shield region) similar to curve "a" shown in FIG. 1 is obtained by an ion implanting condition where boron (B) is used as an implanting ion and an energy of the ion beam is 10-30 KeV with a dose of $1 \times 10^{13}$ to $1 \times 10^{14} cm^{-3}$.

Figure 10E:
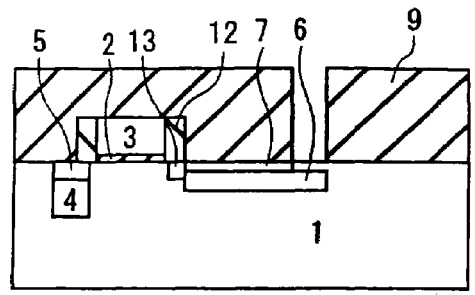

As shown in FIG. 10E, after the resist pattern 92 is removed, an interlayer dielectric 9 is deposited on the p-type well 1. Openings are formed in the interlayer dielectric 9 and the openings correspond to a part of the p-type well 1 under which the drain region 6 is formed. However, the openings do not correspond to the drain shield region 7.

Figure 10F:
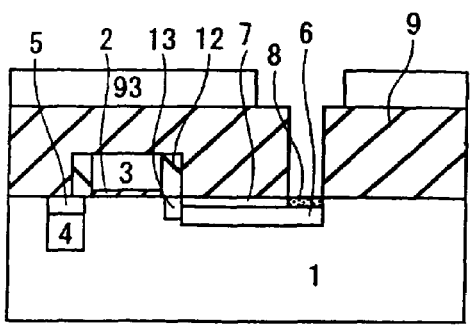

As shown in FIG. 10F, a resist pattern 93 is deposited on the interlayer dielectric 9 and phosphorus (P) is implanted into the exposed surface part of the p-type well 1 to form a contact 8, which contacts the drain region 6. The contact 8 is formed in the p-type well 1, above the drain region 6 and next to the drain shield region 7. The contact 8 may or may not directly contact the drain shield region 7.

Figure 10G:
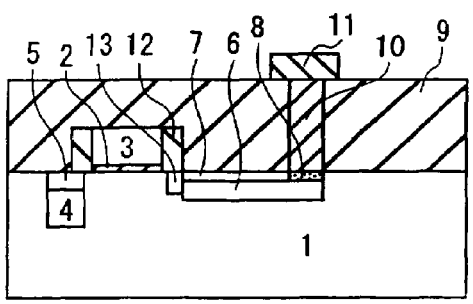

As shown in FIG. 10G, after the resist pattern 93 is removed, a plug 10 is formed by W-CVD in the openings of the interlayer dielectric 9. The plug 10 electrically contacts the contact 8. A wiring 11 is formed on the plug 10 to electrically contact the plug 10.

Figure 11:
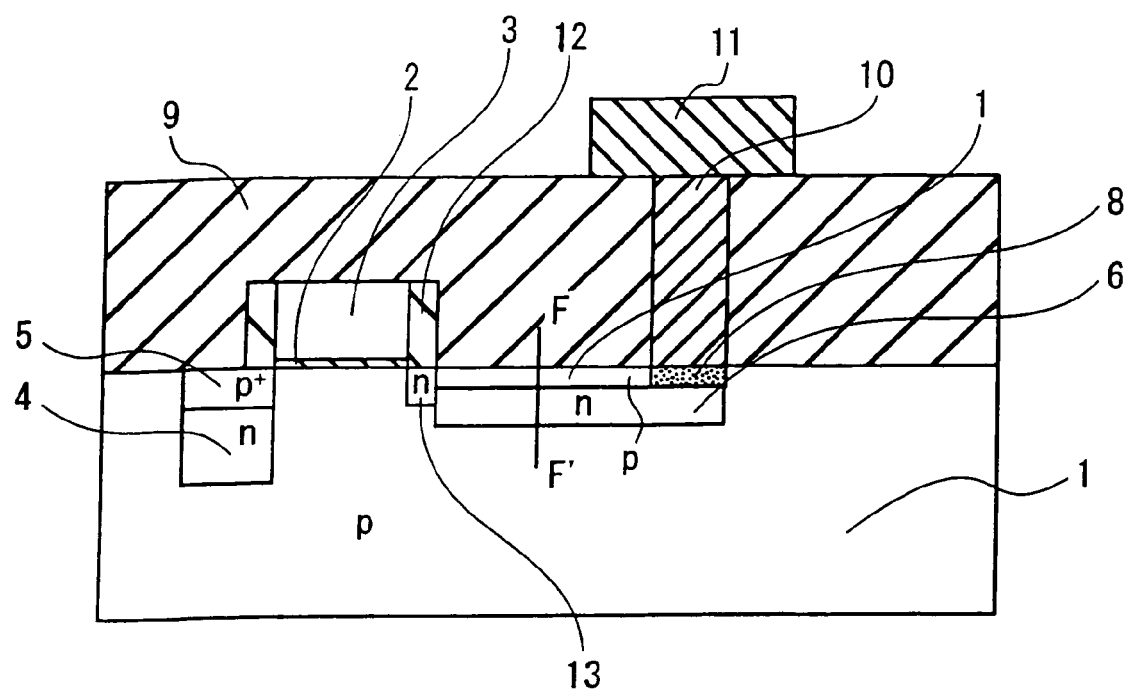
FIG. 11 is a cross sectional view of a semiconductor device according to another embodiment of the present invention.

A sixth embodiment of the present invention will be explained with reference to FIG. 11. FIG. 11 illustrates a cross sectional view of a solid state image sensor.

With respect to each element of the image sensor of the sixth embodiment, the same element of the solid state image sensor of the first, second, third, fourth, or fifth embodiments shown in FIG. 1 to FIG. 10G is designated by the same reference numeral, and the explanation of that element is omitted. Comparing the image sensor of the present embodiment to the image sensor of the fifth embodiment, the solid state image sensor of the present embodiment does not have a drain shield region formed above the drain region 6. Thus, the impurity region 13 will block a leak current between the conversion region 4 and the drain region 6 to enter a portion of the p-type well 1 that if formed between the drain region 6 and the interlayer dielectric 9.

An impurity concentration profile in a depth direction of the drain region, taken along the F-F' line in FIG. 11, is similar to the impurity concentration of the image sensor of the fifth embodiment shown in FIG. 9, and thus the explanation of the impurity concentration profile is omitted.

In the solid state image sensor according to this embodiment, because the drain region 6 is provided in the region where the density of the surface states or crystal defects is lower than in the surface of the p-type well, it is less likely for the charges from the photoelectric conversion region to be trapped by the surface states or crystal defects. Thus, a leak current that occurs from or into the drain region is reduced.

Moreover, the S/N ratio (signal/noise ratio) of the image sensor of the present embodiment is improved because the charges are less likely to be trapped by the surface states or crystal defects, and the charges stored in the photoelectric conversion region 4 are easier to be discharged.

Also, because the impurity region 13 is formed near the gate electrode 3, in the surface part of the p-type well 1 and in contact to the drain region 6, the charges stored in the photoelectric conversion region 4 are more easily discharged to the drain region 6 than in a conventional device because a current from the conversion region 4 is blocked from flowing to the drain region 6 through a surface part of the well, in which the density of surface state and crystal defects is high. In addition, the S/N ratio of the image sensor of the present embodiment is improved even though no drain shield region is present.

Other embodiments of the present invention will be apparent to those skilled in the art from consideration of the specification and practice of the invention disclosed herein. It is intended that the specification and the embodiments disclosed be considered as exemplary only, with a true scope and spirit of the invention being indicated.

What is claimed is:

1. A solid-state image sensor comprising:
 a well of a first conductivity type;
 a photoelectric conversion region having a second conductivity type formed in the well, and configured to store charges obtained from a photoelectric conversion;
 a drain region having the second conductivity type formed in the well apart from a surface of the well in a depth direction of the well;
 a drain shield region having the first conductivity type formed in the well, the drain shield region being formed in a surface part of the well directly above the drain region; and
 a gate electrode formed on the surface of the well via a gate insulator, the gate electrode being configured to transfer the charges from the photoelectric conversion region to the drain region.

2. The solid-state image sensor of claim 1, wherein an impurity concentration of the drain shield region is no less than an impurity concentration of the well.

3. The solid-state image sensor of claim 1, wherein the drain shield region is configured to directly contact the drain region.

4. The solid-state image sensor of claim 1, wherein the drain region extends along the surface of the well under the gate electrode.

5. The solid-state image sensor of claim 1, wherein an upper surface of the drain shield region substantially coincides with the surface of the well.

6. The solid-state image sensor of claim 1, wherein the drain region and the drain shield region are separated from each other.

7. The solid-state image sensor of claim 1, wherein an impurity concentration of the drain region is lower than an impurity concentration of the well.

8. The solid-state image sensor of claim 1, further comprising:
 an impurity region having the second conductivity type formed in the well and configured to directly contact the drain region.

9. The solid-state image sensor of claim 8, further comprising:
 a sidewall formed on side parts of the gate electrode,
 wherein a portion of the impurity region is provided directly under the sidewall.

10. The solid-state image sensor of claim 1, wherein the photoelectric conversion region is formed apart from the surface of the well in the depth direction of the well.

11. The solid-state image sensor of claim 1, wherein the drain region is located inside the well underneath the surface of the well in the depth direction of the well so that the drain region does not contact the surface.

* * * * *